United States Patent
Kubota et al.

(10) Patent No.: US 6,743,645 B2
(45) Date of Patent: Jun. 1, 2004

(54) METHOD OF INSPECTING PROCESS FOR MANUFACTURING SEMICONDUCTOR DEVICE AND METHOD OF MANUFACTURING SEMICONDUCTOR DEVICE

(75) Inventors: Takeo Kubota, Kawasaki (JP); Atsushi Shigeta, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 134 days.

(21) Appl. No.: 10/107,360

(22) Filed: Mar. 28, 2002

(65) Prior Publication Data

US 2002/0142498 A1 Oct. 3, 2002

(30) Foreign Application Priority Data

Mar. 30, 2001 (JP) ........................................ 2001-101166

(51) Int. Cl.$^7$ ............................................... H01L 21/66
(52) U.S. Cl. ............................ 438/14; 438/8; 438/592; 118/719; 356/630; 356/631; 356/632; 382/145; 382/151; 382/174; 250/311; 250/397
(58) Field of Search ........................... 438/592, 16, 14, 438/8, 9, 689, 714; 118/719; 356/630, 631, 63; 382/145, 151, 17; 250/311, 397; 427/8, 9, 10, 84, 85

(56) References Cited

U.S. PATENT DOCUMENTS

| | | | |
|---|---|---|---|
| 4,806,774 A | * | 2/1989 | Lin et al. ..................... 250/550 |
| 5,191,213 A | * | 3/1993 | Ahmed et al. ............... 250/310 |
| 5,923,034 A | * | 7/1999 | Ogasawara et al. ......... 250/311 |
| 6,306,669 B1 | | 10/2001 | Yano et al. |
| 6,366,688 B1 | * | 4/2002 | Jun et al. ..................... 382/145 |
| 6,400,454 B1 | * | 6/2002 | Noguchi et al. ......... 356/237.3 |
| 6,493,097 B1 | * | 12/2002 | Ivarsson ...................... 356/630 |

FOREIGN PATENT DOCUMENTS

JP 9-89525 4/1997

* cited by examiner

Primary Examiner—Matthew Smith
Assistant Examiner—Victor Yevsikov
(74) Attorney, Agent, or Firm—Finnegan, Henderson, Farabow, Garrett & Dunner, L.L.P.

(57) ABSTRACT

A method of inspecting a process for manufacturing a semiconductor device, used to determine the status of a processing operation during the manufacturing process, according to the embodiment of the present invention, comprises: detecting an image of a desired area of a surface of a semiconductor workpiece after it has been subjected to the processing operation, using an image signal detector; detecting image signal intensity at each pixel of a plurality of pixels of the image signal detector; and determining the status of the processing operation based on the relationship between the image signal intensity and the number of pixels at each of certain levels of the image signal intensity. A method of manufacturing a semiconductor device is made by utilizing the above-described inspection method.

18 Claims, 8 Drawing Sheets

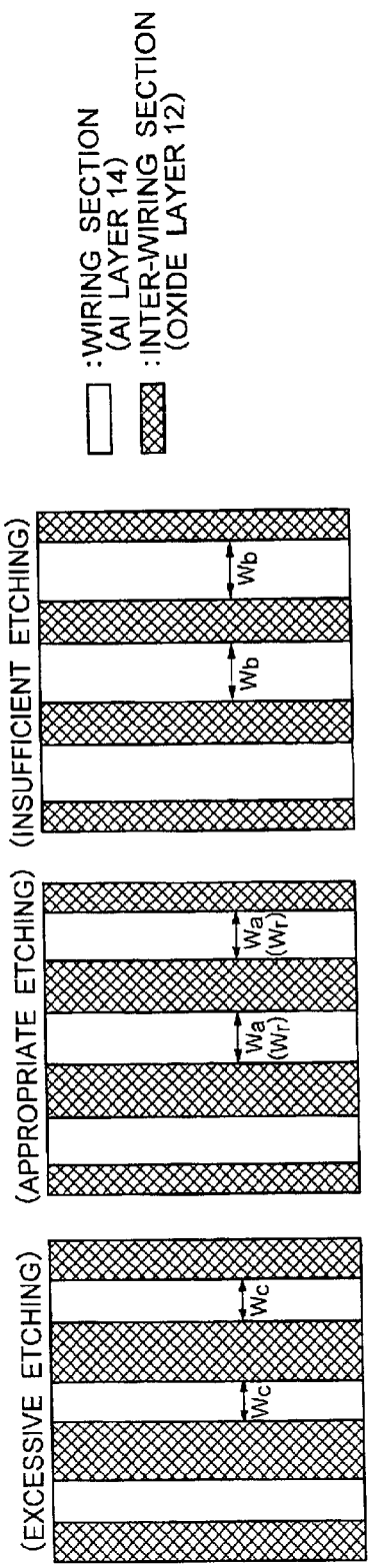
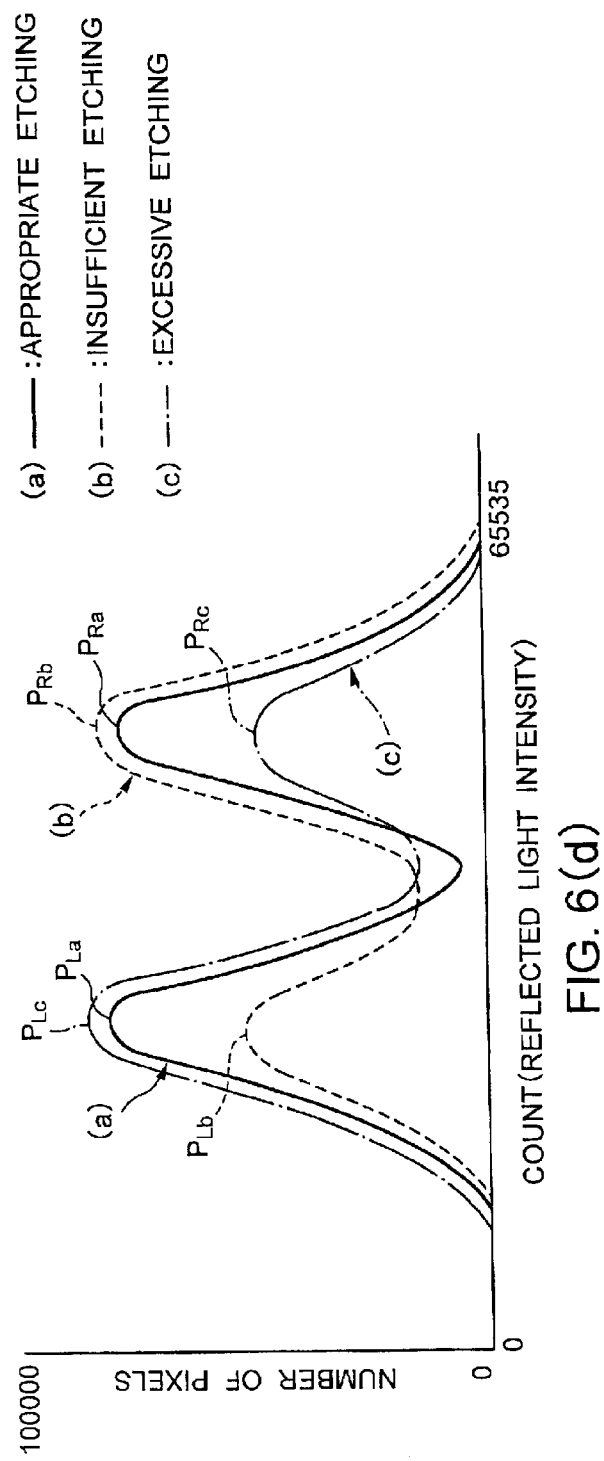

METHOD OF INSPECTING PROCESS FOR MANUFACTURING SEMICONDUCTOR DEVICE AND METHOD OF MANUFACTURING SEMICONDUCTOR DEVICE

CROSS-REFERENCE TO RELATED APPLICATIONS

This application claims the benefit of priority under 35USC §119 to Japanese Patent Application No. 2001-101166, filed on Mar. 30, 2001, the entire contents of which are incorporated herein by reference herein.

FIELD OF THE INVENTION

The present invention relates to a method of inspecting a process for manufacturing a semiconductor device, and a method of manufacturing a semiconductor device using this inspection method. More particularly, the present invention relates to a method of inspecting whether a semiconductor workpiece, which has been subjected to CMP (Chemical Mechanical Polishing), RIE (Reactive Ion Etching), etc., in the process for manufacturing a semiconductor device, is properly processed, and to a method of manufacturing a semiconductor device, in which after the endpoint of a current manufacturing step is detected by using this inspection method, the next manufacturing step is performed.

BACKGROUND OF THE INVENTION

Recently, the width of wirings in semiconductor devices has become miniaturized. Furthermore, there are semiconductor devices that have a multi-layered wiring structure. Under such circumstances, the CMP (Chemical Mechanical Polishing) technique for smoothing semiconductor workpieces, the RIE (Reactive Ion Etching) technique, which is one of the anisotropic etching techniques, etc., are important techniques. Conventionally, inspection of a semiconductor workpiece, which has been subjected to the CMP, the RIE, etc., is performed in various ways, such as 1) inspecting the surface of a processed semiconductor workpiece with the naked eye by the use of an optical microscope, etc., 2) performing computer-analysis of the results of the measurement of a processed semiconductor workpiece, 3) measuring the thickness of each layer of a part of the surface of a processed semiconductor workpiece, and determining the condition of the entire semiconductor workpiece based on the measurement results, 4) calculating the average of the intensity of light reflected from the surface of a semiconductor workpiece, thereby determining the condition of the entire semiconductor workpiece.

However, it is extremely difficult to determine the condition of the entire semiconductor workpiece by simply measuring the thickness of a part of a layer of the semiconductor workpiece. Furthermore, it is difficult to inspect whether the minuscule wiring section is properly processed based on the above-described layer-thickness measuring methods. Moreover, the above-described layer-thickness measuring methods are performed based on, for example, the ratio of light reflected from the surface of the semiconductor workpiece. In such a case, it is necessary to analyze the reflectance, but an accurate measurement of the reflectance is required to perform the analysis. On the other hand, in the above-described methods for determining the conditions of the surface of a semiconductor workpiece based on the average of the intensity of reflected light, although it is possible to measure a vast area using these methods, all the information obtained for the measured vast area is not fully utilized. Accordingly, the inspection results are not very reliable. Furthermore, generally speaking, it is desirable if the time required for inspecting a semiconductor workpiece in each process step is relatively short.

BRIEF SUMMARY OF THE INVENTION

A method of inspecting a process for manufacturing a semiconductor device, used to determine the status of a processing operation during the manufacturing process, according to an embodiment of the present invention, comprises: detecting an image of a desired area of a surface of a semiconductor workpiece after it has been subjected to the processing operation, using an image signal detector; detecting image signal intensity at each pixel of a plurality of pixels of the image signal detector; and determining the status of the processing operation based on the relationship between the image signal intensity and the number of pixels at certain levels of the image signal intensity.

A method of manufacturing a semiconductor device, according to the other embodiment of the present invention, comprises: performing either a polishing operation or an etching operation on a semiconductor workpiece; detecting an image of a desired area of the semiconductor workpiece after it has been subjected to the polishing operation or the etching operation, using a image signal detector; detecting image signal intensity at each pixel of a plurality of pixels of the image signal detector; and detecting an endpoint of the polishing operation or the etching operation by determining the status of the polishing operation or the etching operation based on the relationship between the image signal intensity and the number of pixels at certain levels of the image signal intensity, and proceeding to a next processing operation after the detection of the endpoint.

BRIEF DESCRIPTION OF THE DRAWINGS

FIGS. 6(a) to 6(c) are plain surface pattern drawings of the surface of a semiconductor workpiece in the cases where the RIE operation shown in FIGS. 5(a) and 5(b) is properly performed, underdone, and overdone, respectively.

FIG. 6(d) is a graph showing the relationships between the intensity of reflected light and the number of pixels in FIGS. 6(a) to 6(c).

DETAILED DESCRIPTION OF THE INVENTION

First, characteristic features of the embodiments of the present invention will be briefly described below.

During the process for manufacturing a semiconductor device, the surface of the semiconductor workpiece is irradiated with, for example, light from a Xe lamp after being subjected to the CMP, RIE, etc. Then, a CCD area sensor (CCD) detects light reflected from the semiconductor workpiece (reflected light) to convert the intensity of the reflected light to a numeric value for each pixel (picture element) of the CCD. Thereafter, the relationship between the intensity of the reflected light and the number of pixels is shown in a graph and analyzed based on the relationship between each pixel and the reflected light intensity thereof, thereby determining whether or not the process has been properly performed. After it is determined that the above process is properly performed, the process goes on to the next step.

Hereinafter, the embodiments of the present invention will be specifically described with reference to the accompanying drawings.

First Embodiment

Figure 1A:
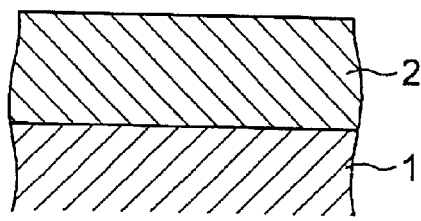
FIGS. 1(a) to 1(f) are sectional views showing a process for forming damascene wiring according to a first and a second embodiment of the present invention.
Figure 1B:
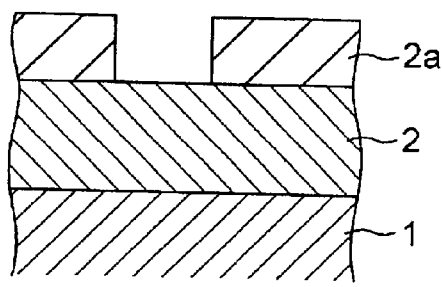
Figure 1C:
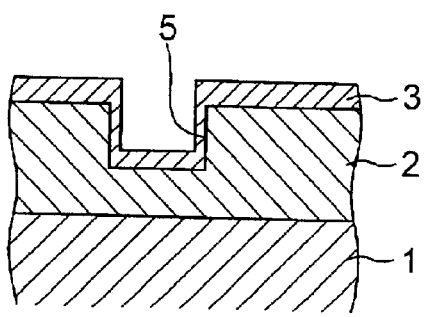
Figure 1D:
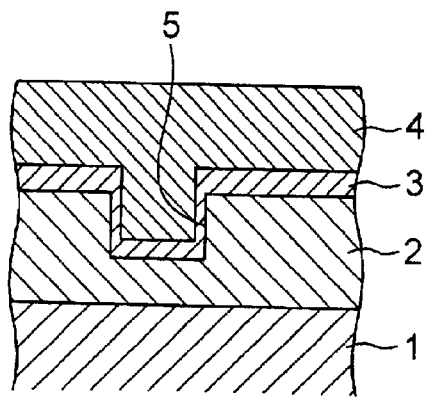
Figure 1E:
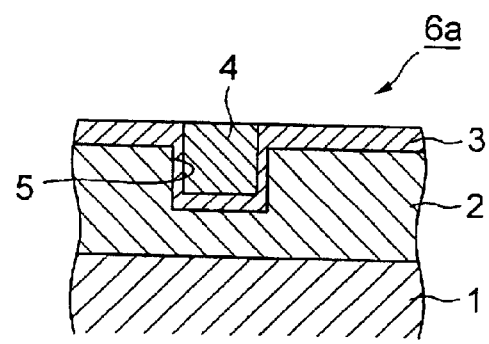
Figure 1F:
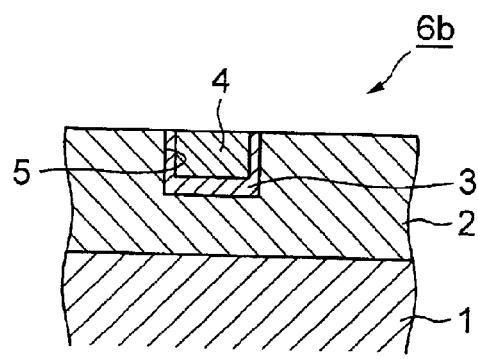

FIGS. 1(a) to 1(f) are sectional views showing a series of steps for forming damascene wiring. A first embodiment of the present invention is for inspecting whether the manufacturing step from the state shown in FIG. 1(d) to the state shown in FIG. 1(e) is properly performed, and a second embodiment of the present invention is for inspecting whether the manufacturing step from the state shown in FIG. 1(e) to the state shown in FIG. 1(f) is properly performed. Accordingly, the first embodiment of the present invention will be described below with reference to FIGS. 1(d) and 1(e).

First, a semiconductor workpiece that is halfway through the manufacturing process as shown in FIG. 1(d) is processed to make a semiconductor workpiece as shown in FIG. 1(e). As shown in FIG. 1(d), an insulating layer (oxide layer) 2 having a groove 5, which is 4,000 Å in depth, is formed on a semiconductor substrate 1, on which some elements (not shown) were formed in advance. Then, a TaN liner of 200 Å in thickness and a Cu layer 4 of 6,000 Å in thickness are formed on the oxide layer 2. Next, the Cu layer 4 is polished (Cu main CMP). FIG. 1(e) shows the state where the polishing of the Cu layer 4 is properly performed to expose the surface of the TaN liner 3 (except for the portion of the groove 5). At this point, the polishing should be stopped. The level of the polishing of the Cu layer 4 should be appropriate. That is, when the state shifts from FIG. 1(d) to FIG. 1(e), the Cu layer 4 should not be underpolished or overpolished. Whether the Cu layer 4 is properly polished, i.e., whether or not the Cu layer 4 is underpolished when the state shifts from FIG. 1(d) to FIG. 1(e), is inspected in the following way.

Figure 2A:
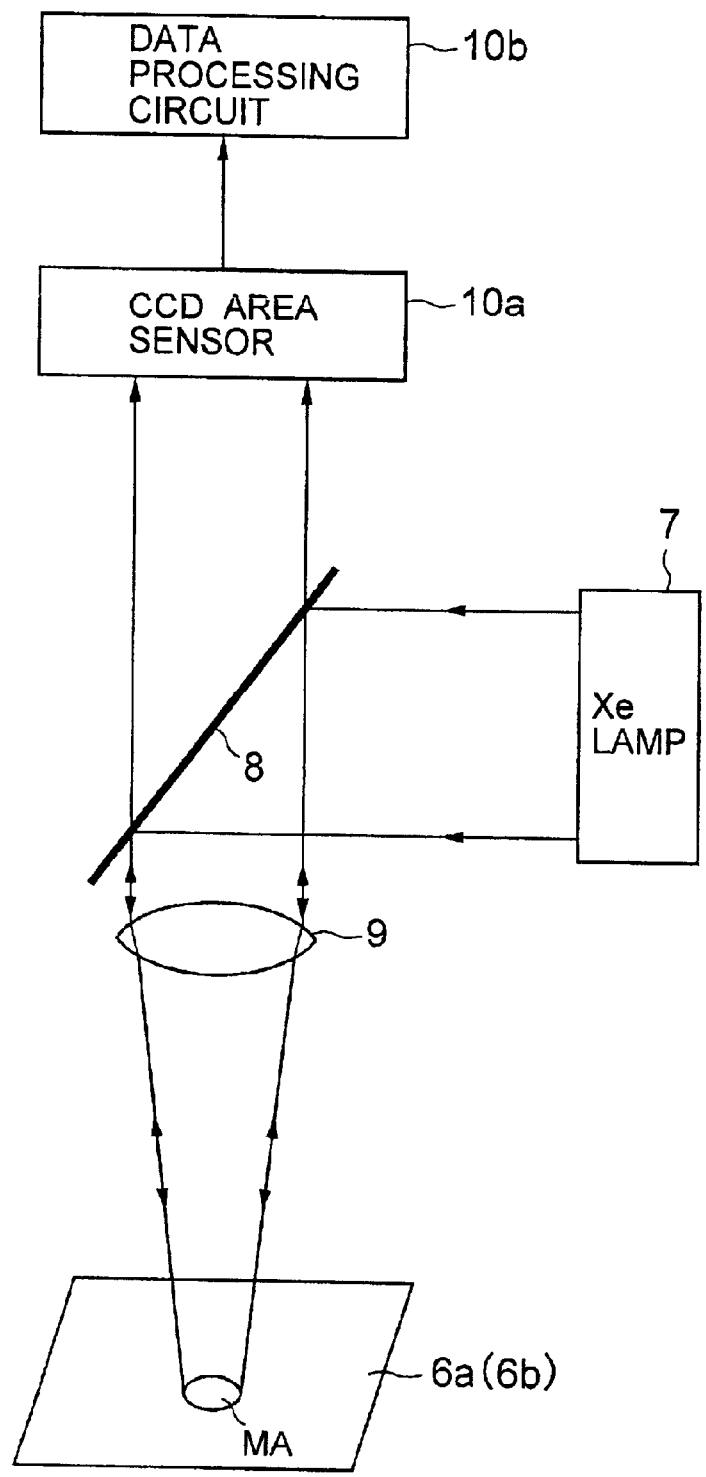
FIG. 2(a) shows the structure of an apparatus for detecting an image of the surface of a semiconductor workpiece, used in the first and the second embodiment.
Figure 2B:
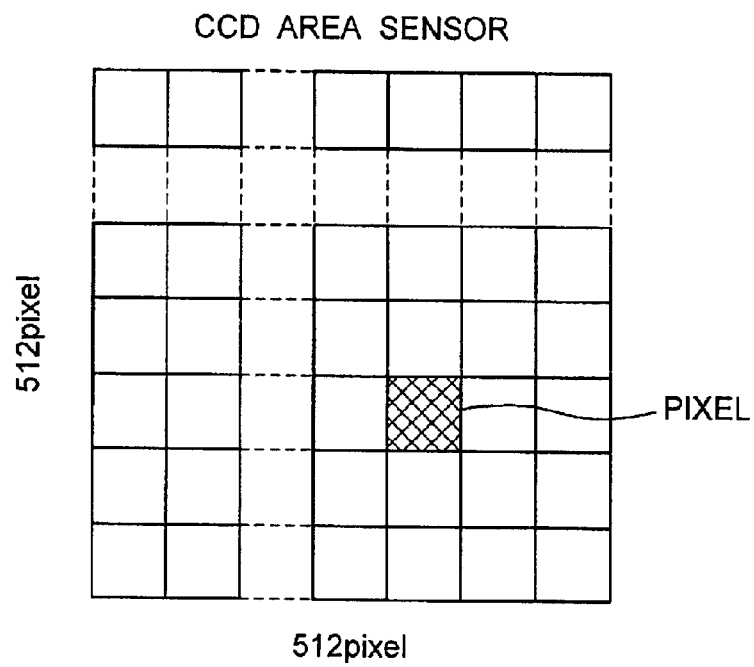
FIG. 2(b) shows an example of a CCD area sensor used in the apparatus shown in FIG. 2(a).

FIG. 2(a) shows the entire structure of an apparatus used in the above-described inspection. FIG. 2(b) specifically shows a CCD area sensor 10a used in this apparatus. As shown in FIG. 2(b), the CCD area sensor 10a is configured to have 512×512=262,144 pixels.

Figure 3:
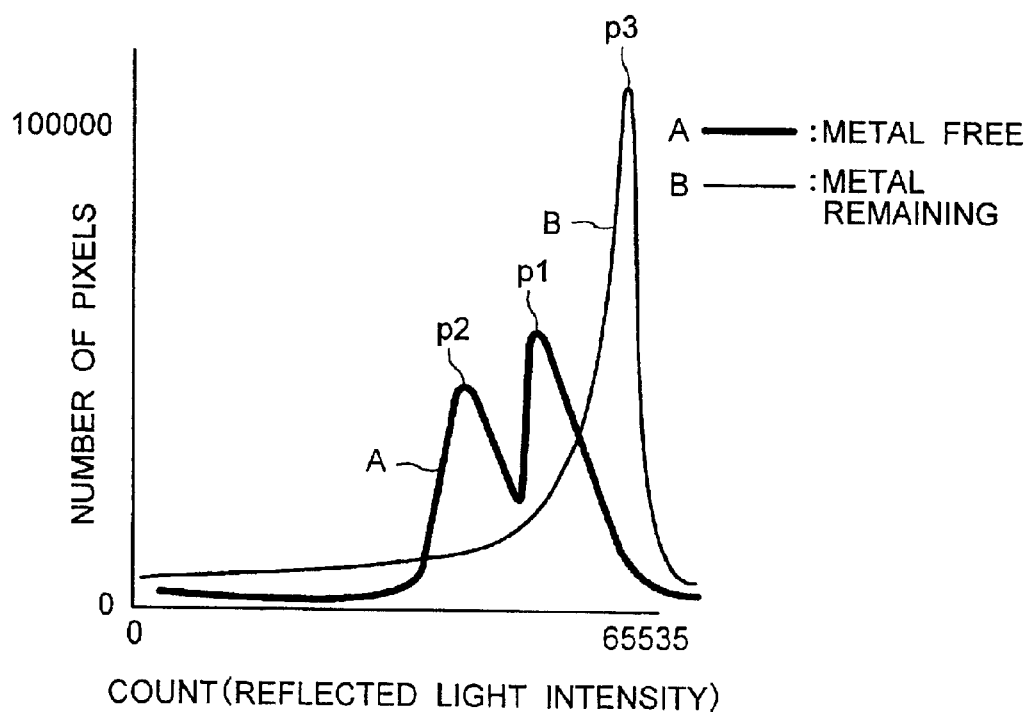
FIG. 3 is a graph showing the case where the CMP operation is properly performed and the case where the CMP operation is improperly performed (underpolishing) with respect to the first embodiment.

In order to use the apparatus shown in FIG. 2(a), first, light is emitted from a Xe lamp 7, which passes through a half mirror 8 and a lens 9 to reach a measurement area MA on the surface of a semiconductor workpiece 6a to be inspected. Upon having reached the measurement area MA, the light is reflected. The magnification of the optical system can be arbitrarily set depending on the purposes. The light reflected from the measurement area MA passes the half mirror 8 to reach the CCD area sensor 10a, where the light is detected in such a manner that at each pixel of the CCD area sensor 10a, the reflected light from at most one wiring line of the surface of the semiconductor workpiece 6a is detected, i.e., the reflected lights from a plurality of wiring lines are not detected at the same time, by properly setting the magnification of the optical system. That is, the lights from a plurality of wiring lines are not detected at the same time. The reflected light detected by each pixel of the CCD area sensor 10a is converted to an electrical signal corresponding to the intensity of the reflected light. The converted electrical signal is further converted to 0 to 65,535 ($2^{16}-1$) count value (reflected light intensity) pixel by pixel by a data processing circuit 10b including a 16-bit A/D converter, etc. Then, the number of pixels for each count value is calculated by a computer. The graph of FIG. 3 shows the relationship between each count value and the corresponding pixel number. The bold graph line A represents the result of the calculation for a properly-polished semiconductor workpiece (metal free), and the graph line B represents the result of the calculation for an insufficiently-polished semiconductor workpiece (metal remaining). Specifically, in FIG. 3, the bold graph line A and the graph line B are shown in the coordinate system, in which the horizontal axis represents count value corresponding to intensity of reflected light, and the vertical axis represents the number of pixels. This FIG. 3 shows namely the frequency distribution of the number of pixels.

As mentioned previously, in the semiconductor workpiece 6a after the Cu main CMP, the Cu layer 4 has been removed except for the portion filling the groove 5, as shown in FIG. 1(e). That is, in the target state shown in FIG. 1(e), the semiconductor workpiece 6a has been processed such that the Cu layer 4 has been polished to expose the TaN liner 3 in the upper area of the device except for the portion corresponding to the groove 5. The reflectance of the Cu layer 4 is higher than that of the areas other than the Cu layer 4 (such as the TaN liner 3). Accordingly, if the processed semiconductor workpiece 6a is in the target state shown in FIG. 1(e), the number of pixels has two peaks, i.e., peak p1 representing the Cu layer 4, which has the higher reflectance, and peak p2 representing the above-described the other areas, which have the lower reflectance, as shown in the bold graph line A labeled "metal free" in FIG. 3. If the CMP operation is insufficiently performed, and most of the surface of the processed semiconductor workpiece 6a to be inspected is covered by the Cu layer 4, most of the light emitted from the Xe lamp 7 is reflected on the Cu layer 4. Accordingly, the number of pixels has only one peak p1 representing the Cu layer 4, as shown in the graph line B labeled "metal remaining."

As described above, according to this embodiment, the image of the semiconductor workpiece after being subjected to the CMP operation is detected to make a graph. If there is only one peak in a portion representing a higher reflected light intensity, it is determined that the semiconductor workpiece is underpolished. On the contrary, if there are two peaks at a portion representing a higher reflected light intensity and a portion representing a lower reflected light intensity, it is determined that the semiconductor workpiece has been processed to achieve the target condition. Thus, it is possible to inspect semiconductor workpieces after being subjected to the CMP operation by evaluating any of or any combination of the number of peaks, the position of the peak, and the height of the peak in the graph. Furthermore, by performing the measurement and the evaluation during the CMP operation, it is possible to determine the endpoint of the CMP operation.

Although the graph made based on the actual measurement of the semiconductor workpiece is directly evaluated in this embodiment, the graph may be compared with a reference graph made based on actual measurement or theoretical values. Furthermore, although the semiconductor workpiece is irradiated with white light from the Xe lamp 7 in order to detect the image of the surface of the semiconductor workpiece in this embodiment, the semiconductor workpiece may be irradiated with other kinds of monochromatic light, such as visible light, infrared light, etc. When the monochromatic light is detected by the CCD area sensor 10a, either the monochromatic light reflected on the surface of the semiconductor workpiece is directly detected or the white light reflected on the surface of the semiconductor workpiece is made monochromatic by a monochromatic filter, and then detected.

Second Embodiment

As mentioned previously, this embodiment is for inspecting whether the manufacturing step between the state shown in FIG. 1(e) and the state shown in FIG. 1(f) has been properly performed. Accordingly, this embodiment will be described with reference to these drawings.

The semiconductor workpiece 6a shown in FIG. 1(e) is further polished by the CMP (Cu touch-up CMP). That is, the TaN liner 3 at the surface of the semiconductor workpiece 6a is polished until the surface of the oxide layer 2 is exposed, as shown in FIG. 1(f). In order to achieve this, it is necessary to properly polish the TaN liner 3. That is, the polishing should not be insufficient, so as to leave some portions of the TaN lier 3 on the surface of the oxide layer 2, and the polishing should not be excessively done, so as to make the Cu layer 4 too thin. Whether or not the polishing level is appropriate is inspected in the following manner.

First, as in the case of the first embodiment, the apparatus shown in FIG. 2(a) is used in such a manner that light is emitted from the Xe lamp 7, and the reflected light reflected from the measurement area on the surface of a semiconductor workpiece 6b is detected by the CCD area sensor 10a. As described above, in the first embodiment, a single pixel does not detect reflected lights from a plurality of wiring lines. However, in this embodiment, the magnification is changed so that a single pixel detects reflected lights from a plurality of wiring lines. Thereafter, a graph is made as in the case of the first embodiment.

Figure 4A:
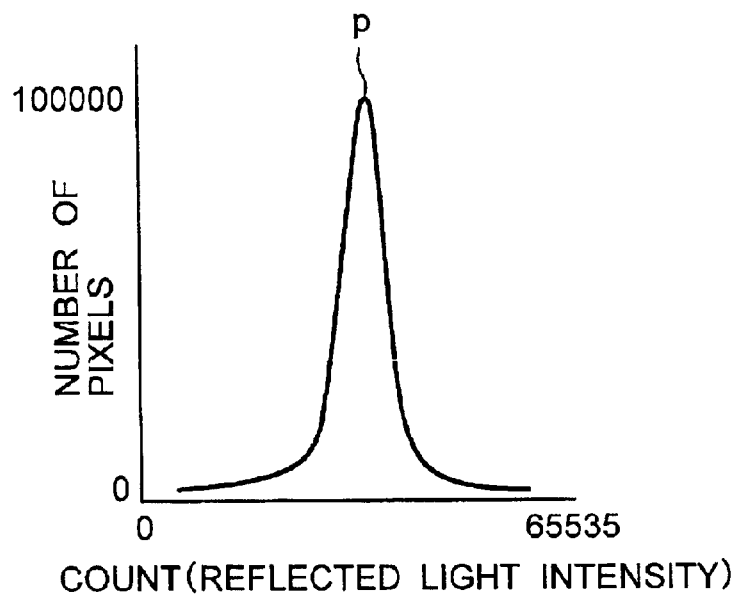
FIGS. 4(a) and 4(b) are graphs showing the case where the CMP operation is properly performed and the case where CMP operation is improperly performed (underpolishing) with respect to the second embodiment.

FIG. 4(a) shows a graph in the case where the manufacturing step between the state shown in FIG. 1(e) and the state shown in FIG. 1(f) is properly conducted. As can be understood from FIG. 4(a), the graph shows the single-peak pattern, having only one peak p, which is positioned at the midpoint of the horizontal axis. The reason for this is as follows. The Cu layer 4 is thick enough to have a constant and high reflectance. Furthermore, the reflectance of the oxide layer 2 varies little due to the variation in thickness, except for the case where the thickness becomes extremely thin due to overpolishing. Moreover, like in this embodiment, if one pixel receives reflected lights from a plurality of wiring lines, although it is difficult to distinguish lights from the wiring lines and lights from the areas between wiring lines, the reflected light intensity of the pixel shows the area ratio of these two kinds of light. Accordingly, the peak of the graph comes to the central portion.

Figure 4B:
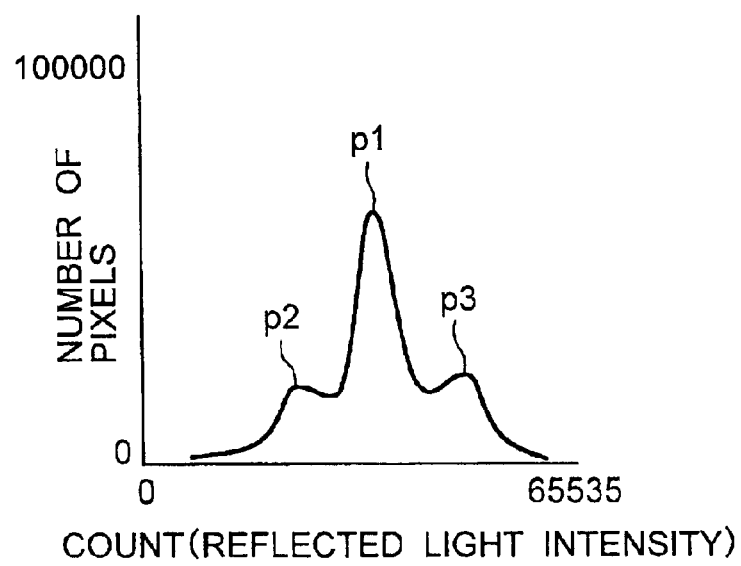

FIG. 4(b) shows a graph in the case where the CMP operation is insufficiently performed. The graph of FIG. 4(b) has one peak p1 at the central portion, and two other peaks p2 and p3 at the sides of peak p1. Thus, the graph shows a horizontally-extending pattern, as compared with the pattern shown in FIG. 4(a). This can be explained as follows. Referring to FIG. 1(e), if the CMP operation is insufficiently performed, the TaN liner (barrier metal) 3 unevenly remains on the surface of the oxide layer 2. There may also be the case where the Cu layer 4 still remains on the remaining TaN liner 3. As the result, the graph has three peaks p1 to p3, as shown in FIG. 4(b). In FIG. 4(b), the right-side peak p3 represents the areas in which the Cu layer 4 remains, the central peak p1 represents the areas achieving the target state, and the left-side peak p2 represents the areas in which the TaN liner 3 remains (but no Cu layer 4 remains thereon). Thus, when the CMP operation is insufficiently performed, the graph does not show the single-peak pattern.

Thus, according to this embodiment, a graph is made for a semiconductor workpiece after being subjected to the CMP operation. If the graph shows the pattern as shown in FIG. 4(b), it can be determined that the CMP operation was insufficiently performed. On the other hand, if the graph shows the steep single-peak pattern as shown in FIG. 4(a), it can be determined that the semiconductor workpiece has been properly processed. That is, it is possible to inspect whether or not the CMP operation is properly performed by evaluating the pattern of the graph. Furthermore, by performing the measurement and the evaluation during the CMP operation, it is possible to determine the endpoint of the CMP operation.

Although the graph made based on the actual measurement of the semiconductor workpiece is directly evaluated in this embodiment, the graph may be compared with a reference graph made based on actual measurement or on theoretical values.

Figure 1G:
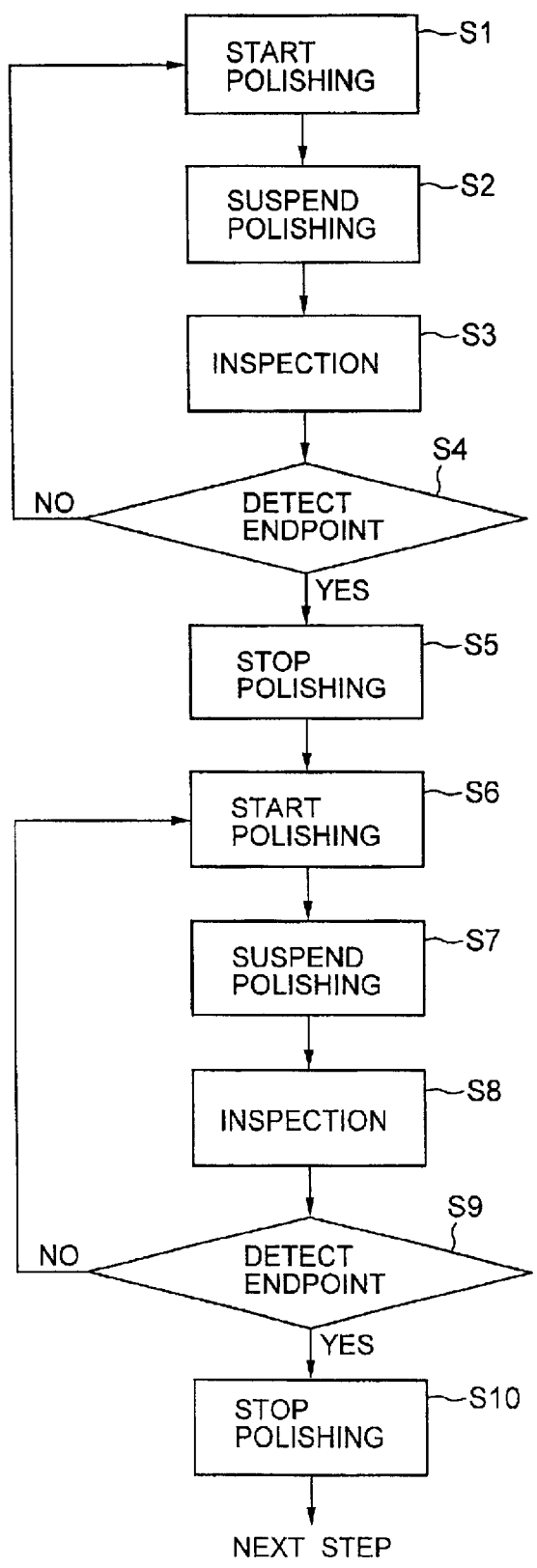
FIG. 1(g) is a flow chart showing the polishing step comprising several steps in the process for forming damascene wiring shown in FIGS. 1(a) to 1(f).

Next, the process for manufacturing damascene wiring including the inspections of the above-described first and the second embodiment will be described with reference to FIGS. 1(a) to 1(g). FIG. 1(g) is a flow chart showing the polishing step in the process for forming damascene wiring.

First, an insulating layer (oxide layer) 2 is deposited on a semiconductor substrate 1, on which some elements (not shown) were formed in advance.

Then, as shown in FIG. 1(b), a photoresist layer is deposited on the oxide layer 2, which is patterned by the photolithography operation to form a photoresist mask 2a.

Thereafter, as shown in FIG. 1(c), a groove 5 of 4,000 Å in depth is formed in the oxide layer 2 using the photoresist mask 2a. Subsequently, a TaN liner 3 of 200 Å in thickness is deposited all over the oxide layer 2.

Then, a Cu layer 4 of 6,000 Å in thickness is formed over the TaN liner 3, as shown in FIG. 1(d).

Subsequently, as shown in FIG. 1(e) and FIG. 1(g) (step 1–5), the step for polishing the Cu layer 4 on the TaN liner 3 starts. That is, as shown in FIG. 1(e) and FIG. 1(g), the Cu layer 4 is polished by the CMP operation to expose the TaN liner 3 (step 1). Then, after a predetermined length of time lapses, the polishing of the Cu layer 4 is suspended (step 2). At this time, the inspection of the first embodiment is performed to determine whether the polishing of the Cu layer 4 has been properly performed (step 3). That is, light is emitted from the Xe lamp 7 toward the polished semiconductor workpiece 6a, and the light reflected on the semiconductor workpiece 6a is detected by the CCD area sensor 10a. In the CCD are a sensor 10a, the detected reflected light is converted to an electrical signal pixel by pixel. Further, the electrical signal is converted to a count value pixel by pixel at the data processing circuit 10b. Then, a graph having the horizontal axis representing count value and the vertical axis representing the number of pixels is made. The state of polishing is determined by directly evaluating the graph, or by comparing the graph with a reference graph. As the result of the evaluation, if it is determined that the Cu layer 4 is insufficiently polished ("NO" in step 4), the Cu layer 4 is polished (step 1) again, and after the predetermined length of time lapses, the polishing of the Cu layer 4 is suspended (step 2). Then, another graph is made to determine the state of polishing (step 3). The polishing of the Cu layer 4 and the creation and evaluation of graph are repeated until it is determined that the Cu layer 4 is properly polished. If it is determined that the Cu layer 4 is properly polished, and the endpoint of the polishing operation is detected ("YES" in step 4), the polishing of the Cu layer 4 is stopped (step 5).

Next, as shown in FIG. 1(f) and FIG. 1(g) (step 6 to 10), the process goes on to the step of polishing the TaN liner 3 on the oxide layer 2. That is, as shown in FIGS. 1(f) and 1(g), the TaN liner 3 is polished by the CMP to expose the surface of the oxide layer 2 (step 6). After a predetermined length of time lapses, the polishing of the TaN liner 3 is suspended (step 7). At this time, the inspection of the second embodiment is performed in order to inspect whether or not the TaN liner 3 is properly polished (step 8). That is, light is emitted from the Xe lamp 7 toward the polished semiconductor workpiece 6b, and the light reflected on the semiconductor workpiece 6b is detected by the CCD area sensor 10a. In the CCD area sensor 10a, the detected reflected light is converted to an electrical signal pixel by pixel. Further, the electrical signal is converted to a count value pixel by pixel at the data processing circuit 10b. Then, a graph having the horizontal axis representing count value and the vertical axis representing the number of pixels is made. The state of polishing is determined by directly evaluating the graph, or by comparing the graph with a reference graph. As the result of the evaluation, if it is determined that the TaN liner 3 is insufficiently polished ("NO" in step 9), the TaN liner 3 is polished (step 6) again, and after the predetermined length of time lapses, the polishing of the TaN liner is suspended (step 7). Then, another graph is made to determine the state of polishing (step 8). The polishing of the TaN liner 3 and the creation and evaluation of graph are repeated until it is determined that the TaN liner 3 is properly polished. If it is determined that the TaN liner 3 is properly polished and the endpoint of the polishing operation is detected ("YES" in step 9), the polishing of the TaN liner 3 is stopped (step 10). As the result, the damascene wiring is formed. Thereafter, the next step, such as depositing an interlayer dielectric layer all over the semiconductor workpiece 6b having the damascene wiring, is performed.

Third Embodiment

In the descriptions of the first and the second embodiment, the inspections of the semiconductor workpieces after the CMP operation were explained. With respect to the third embodiment, an example of inspecting a semiconductor workpiece after the RIE operation will be described.

Figure 5A:
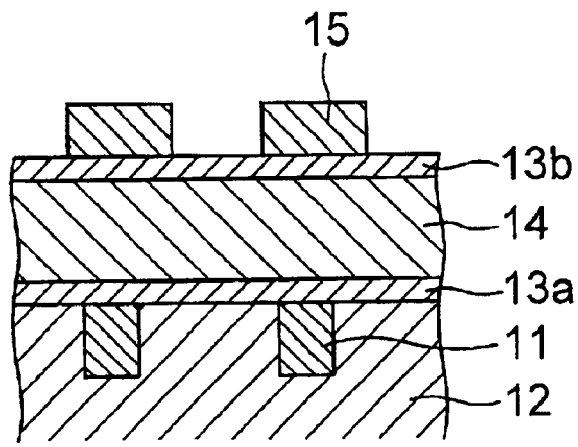
FIGS. 5(a) and 5(b) are drawings explaining a third embodiment of the present invention, which show a process for forming aluminum layer wiring through the RIE operation.
Figure 5B:
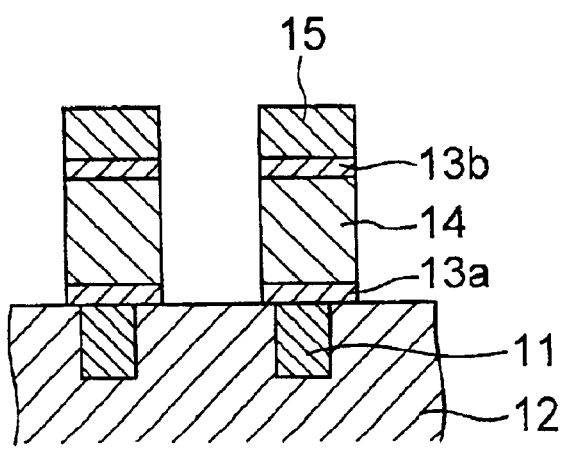

FIGS. 5(a) and 5(b) are sectional views showing the manufacturing step of patterning an Al layer 14 by the RIE method.

First, a semiconductor workpiece as shown in FIG. 5(a) is prepared. That is, a W plug 11 is buried in an oxide layer 12 formed on a substrate (not shown), and a TiN liner 13a, an Al layer 14, and a TiN liner 13b are deposited in this order on the oxide layer 12 and the W plug 11. Then, a photoresist mask 15 having a desired pattern is formed on the TiN liner 13b. Subsequently, the TiN liner 13b, the Al layer 14, and the other TiN liner 13a are etched via the RIE method using the photoresist mask 15, as shown in FIG. 5(b). Ideally, the RIE operation is stopped when the surface of the oxide layer 12 is exposed, as shown in FIG. 5(b), so that the wiring width of the Al layer 14 after the etching operation stays at a predetermined value.

In order to achieve this, the etching should be properly performed. That is, the etching should not be insufficient, so as to make the wiring width of the Al layer 14 too wide, and the etching should not be excessively performed, so as to make the wiring width too narrow. In this embodiment, whether or not the etching level is appropriate is inspected in the following manner. First, a theoretical graph is made based on the designed wiring widths. On the other hand, the image of miniaturized wiring lines to be inspected is detected by an SEM (Scanning Electron Microscope) to make a graph showing the relationship between the reflected light intensity and the number of pixels. Then, this graph made based on the actual measurement is compared with the theoretical graph. The etching level is determined based on the comparison result. Of course, it is possible to perform the inspection by evaluating the graph made based on the actual measurement itself.

Hereinafter, the above-described manufacturing step will be described with reference to FIGS. 6(a) to 6(d).

In this embodiment, the measurement area is a wiring area, which includes plural wiring lines.

Further, in this embodiment, the image is detected by the SEM, as previously mentioned. An electron beam is advantageous since it can be observed with a high degree of resolution. On the other hand, in the case where light is used, as in the above-described first and second embodiments, light is advantageous since it is possible to observe a vast area at one time. Accordingly, it is advantageous to use either a CCD area sensor or an SEM, depending on the purpose of the inspection.

FIG. 6(d) is a graph made based on an image formed by irradiating the surface of a semiconductor workpiece after it has been subjected to the RIE operation with an electron beam. As can be understood from the solid line (a) in FIG. 6(d) and FIG. 6(a), if the wiring width Wa is substantially the same as the design value Wr, i.e., if the etching level is appropriate, the graph shows two peaks $P_{Ra}$ and $P_{La}$ of substantially the same size. Thus, the graph substantially conforms to the theoretical reference graph (not shown). The right-side peak $P_{Ra}$ represents the TiN liner 13b and/or the Al layer 14 under the photoresist mask 15, and the left-side peak $P_{La}$ represents the oxide layer 12.

As can be understood from FIG. 6(b), if the etching is insufficient, the wiring width Wb becomes larger than the design value Wr. That is, the ratio of the Al layer 14 and the TiN liners 13a and 13b to the whole substrate plane becomes higher. The broken line (b) in FIG. 6(d) indicates this. Accordingly, as can be understood from the broken line (b) in FIG. 6(d) and FIG. 6(b), the number of pixels corresponding to the height of peak $P_{Rb}$ at the higher reflected light intensity side becomes larger, and the number of pixels corresponding to the height of peak $P_{Lb}$ at the lower reflected light intensity side becomes smaller, as compared with those of the theoretical graph.

As can be understood from FIG. 6(c), if the etching is excessively performed, the wiring width (the photoresist mask 15, the TiN liners 13a and 13b, and the Al layer 14) Wc becomes smaller than the designed value Wr, resulting in that level of exposure of the oxide layer 12 is more than the appropriate level, for the amount by which the wiring width is narrowed. Accordingly, as can be understood from the alternate long and short dash line (c) in FIG. 6(d) and FIG. 6(c), the number of pixels corresponding to the height of peak $P_{Lc}$ at the lower reflected light intensity side becomes larger, and the number of pixels corresponding to the height of peak $P_{Rc}$ at the higher reflected light intensity side becomes smaller, as compared with those of the theoretical graph.

As described above, a graph is made for the semiconductor workpiece after it has been subjected to the RIE operation, and if the numbers of pixels at the two portions at the reflected light intensity axis, at which the two peaks are formed, are substantially the same, it is determined that the etching level is appropriate. On the other hand, if the numbers of pixels represented by the two peaks are considerably different from each other, it is determined that the etching level is inadequate. Such an inspection is performed by evaluating the graph made based on the actual measurement itself, or by comparing the graph with a reference graph. Thus, it is possible to inspect a semiconductor workpiece, after it has been subjected to the RIE operation, based on the two peaks in the graph made based on the actual measurement. Furthermore, if the inspection is carried out during the RIE operation, it is possible to determine the end point of the RIE operation.

In this embodiment, the reference graph used in the comparison was prepared by the calculation. However, it is possible to use a graph made based on actual measurement of a reference semiconductor workpiece.

Moreover, in this embodiment, an electron beam was used. However, it is possible to use an other particles beam. In this case, of course a detector suitable for the other particle beam should be used for the inspection.

Figure 5C:
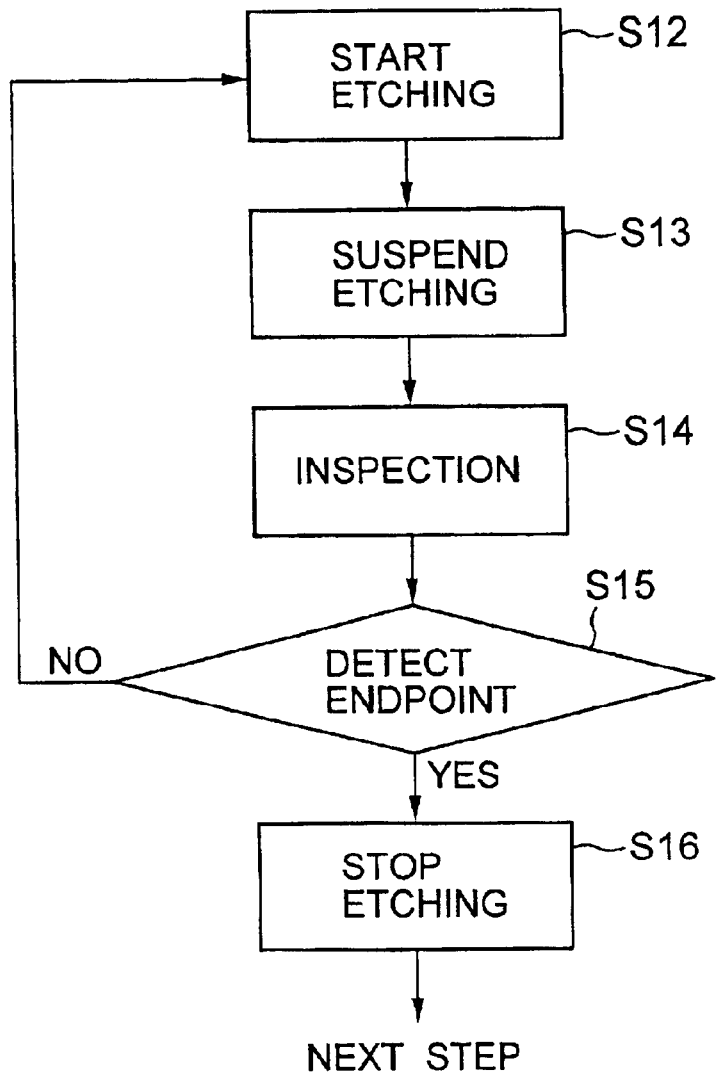
FIG. 5(c) is a flow chart showing the etching step comprising several steps in the process for forming aluminum layer wiring shown in FIGS. 5(a) and 5(b).

Next, a method of manufacturing a semiconductor device using the above-described inspection method will be described with reference to FIGS. 5(a) to 5(c). FIG. 5(c) is a flow chart showing the RIE step comprising several steps in the manufacturing steps.

First, as shown in FIG. 5(a), a W plug 11 is formed in the oxide layer 12. Then, a TiN liner 13a, an Al layer 14, and a TiN liner 13b are deposited in this order on the oxide layer 12 and the W plug 11. Subsequently, a photoresist layer is deposited on the TiN liner 13b, which is patterned by the photolithography method to form a photoresist mask 15. Then, as shown in FIG. 5(b) and FIG. 5(c), the process goes on to the RIE step to etch the TiN liner 13b, the Al layer 14, and the TiN liner 13a (step 12–16). That is, as shown in FIG. 5(b) and FIG. 5(c), the TiN liner 13b, the Al layer 14, and the TiN liner 13a are etched by the RIE method using the photoresist mask 15 (step 12). After a predetermined length of time lapses, the etching of the TiN liner 13b, the Al layer 14, and the TiN liner 13a is suspended (step 13).

At this time, whether or not the RIE is properly performed is inspected by the above-described inspection method (step 14). That is, after the RIE operation, the SEM detects the image of the wiring area to make a graph. The etching level is determined by evaluating the graph itself, or by comparing the graph with a reference graph made based on theoretical values or a reference graph made based on actually-measured values. As a result of the comparison, if it is determined that the etching level is insufficient ("NO" in step 15), further etching of the TiN liner 13b, the Al layer 14, and the TiN liner 13a is performed (step 12). After the predetermined length of time lapses, the etching of the TiN liner 13b, the Al layer 14, and the TiN liner 13a is suspended (step 13). Then, a graph is made to determine the etching level again (step 14). The etching and the creation and evaluation of the graph are repeated until it is determined that the etching level is appropriate. When it is determined that the etching level is appropriate and the endpoint of the etching step is detected ("YES" in step 15), the etching operation is stopped (step 16). Then, the manufacturing process goes on to the next step, e.g., removing the photoresist mask.

Each graph shown in each of FIGS. 3, 4(a), 4(b), and 6(d) can be represented by a histogram.

With the embodiments of the present invention, it is possible to achieve automatization of the inspection of processed semiconductor workpieces and detection of the endpoint of the manufacturing step. Further, it is possible to grasp the state of the processing of a semiconductor workpiece without using complicated image-processing techniques. Further, since the state of the processing of a semiconductor workpiece is identified based on a graph made for the actually manufactured semiconductor workpiece, it is possible to get a more accurate grasp of the state of the processing. Moreover, since the inspection can be carried out without performing the precise measurement of layer-thickness, it is possible to inspect miniaturized wiring sections, on which it is impossible to carry out the measurement of layer-thickness.

Additional advantages and modifications will readily occur to those skilled in the art. Therefore, the invention in its broader aspects if not limited to the specific details and representative embodiments shown and described herein. Accordingly, various modifications may be made without departing from the spirit or scope of the general inventive concept as defined by the appended claims and their equivalents.

What is claimed is:

1. A method of inspecting a process for manufacturing a semiconductor device, used to determine the status of a processing operation during the manufacturing process, comprising:

detecting an image of a desired area of a surface of a semiconductor workpiece after it has been subjected to the processing operation, by using an image signal detector;

detecting image signal intensity at each pixel of a plurality of pixels of the image signal detector; and determining the status of the processing operation based on the relationship between the image signal intensity and the number of pixels at each of certain levels of the image signal intensity, wherein a graph, indicating the number of pixels having a certain level of image signal intensity in a coordinate system having one axis representing the image signal intensity and the other axis representing the number of pixels, is made based on the relationship between the image signal intensity and the numbers of pixels at each of certain levels of the image signal intensity, and the determination of the status of the processing operation is performed by evaluating the graph.

2. The method of inspecting a process for manufacturing a semiconductor device according to claim 1, wherein the desired area of the surface of the semiconductor workpiece is irradiated with an electromagnetic wave, and a reflected wave thereof is detected as the image.

3. The method of inspecting a process for manufacturing a semiconductor device according to claim 2, wherein the image signal detector includes a CCD.

4. The method of inspecting a process for manufacturing a semiconductor device according to claim 1, wherein the desired area of the surface of the semiconductor workpiece is irradiated with an electron beam, and a reflected light thereof is detected as the image.

5. The method of inspecting a process for manufacturing a semiconductor device according to claim 4, wherein the image signal detector includes an SEM.

6. The method of inspecting a process for manufacturing a semiconductor device according to claim 1, wherein a graph, indicating the number of pixels having a certain level of image signal intensity in a coordinate system having one axis representing the image signal intensity and the other axis representing the number of pixels, is made based on the relationship between the image signal intensity and the numbers of pixels at each of certain levels of the image signal intensity, and the determination of the status of the processing operation is performed by comparing the graph with a reference graph, which was prepared in advance.

7. The method of inspecting a process for manufacturing a semiconductor device according to claim 6, wherein the reference graph is made based on theoretical values.

8. The method of inspecting a process for manufacturing a semiconductor device according to claim 6, wherein the reference graph is made based on actual measurement of an actually manufactured semiconductor workpiece.

9. The method of inspecting a process for manufacturing a semiconductor device according to claim 1, wherein the evaluation of the graph is carried out based on at least one of a position of a peak of the pixel numbers, the number of the peak of the pixel numbers, the height of the peak of the pixel numbers, and the distribution of the pixel numbers.

10. A method of manufacturing a semiconductor device, comprising:

performing either a polishing operation or an etching operation on a semiconductor workpiece;

detecting an image of a desired area of the semiconductor workpiece after it has been subjected to the polishing operation or the etching operation, by using a image signal detector;

detecting image signal intensity at each pixel of a plurality of pixels of the image signal detector; and detecting an endpoint of the polishing operation or the etching operation by determining the status of the polishing operation or the etching operation based on the relationship between the image signal intensity and the number of pixels at each of certain levels of the image signal intensity, and proceeding to a next processing operation after the detection of the endpoint, wherein a graph, indicating the number of pixels having a certain level of image signal intensity in a coordinate system being one axis representing the image signal intensity and the other axis representing the number of pixels, is made based on the relationship between the image signal intensity and the numbers of pixels at each of certain levels of the image signal intensity, and the determination of the status of the polishing operation or the etching operation is performed by evaluating the graph.

11. The method of manufacturing a semiconductor device according to claim 10, wherein the desired area of the surface of the semiconductor workpiece is irradiated with an electromagnetic wave, and a reflected wave thereof is detected as the image.

12. The method of manufacturing a semiconductor device according to claim 11, wherein the image signal detector includes a CCD.

13. The method of manufacturing a semiconductor device according to claim 10, wherein the desired area of the surface of the semiconductor workpiece is irradiated with an electron beam, and a reflected light thereof is detected as the image.

14. The method of manufacturing a semiconductor device according to claim 13, wherein the image signal detector includes an SEM.

15. The method of manufacturing a semiconductor device according to claim 10, wherein a graph, indicating the number of pixels having a certain level of image signal intensity in a coordinate system having one axis representing the image signal intensity and the other axis representing the number of pixels, is made based on the relationship between the image signal intensity and the numbers of pixels at each of certain levels of the image signal intensity, and the determination of the status of the polishing operation or the etching operation is performed by comparing the graph with a reference graph, which was prepared in advance.

16. The method of manufacturing a semiconductor device according to claim 15, wherein the reference graph is made based on theoretical values.

17. The method of manufacturing a semiconductor device according to claim 15, wherein the reference graph is made based on actual measurement of an actually manufactured semiconductor workpiece.

18. The method of manufacturing a semiconductor device according to claim 10, wherein the evaluation of the graph is carried out based on at least one of a position of a peak of the pixel numbers, the number of the peak of the pixel numbers, the height of the peak of the pixel numbers, and the distribution of the pixel numbers.

* * * * *